US008309937B2

(12) United States Patent
Kameyama

(10) Patent No.: US 8,309,937 B2
(45) Date of Patent: Nov. 13, 2012

(54) GRID PROVIDING BEAMLET STEERING

(75) Inventor: Ikuya Kameyama, Fort Collins, CO (US)

(73) Assignee: VEECO Instruments, Inc., Plainview, NY (US)

( * ) Notice: Subject to any disclaimer, the term of this patent is extended or adjusted under 35 U.S.C. 154(b) by 96 days.

(21) Appl. No.: 12/898,351

(22) Filed: Oct. 5, 2010

(65) Prior Publication Data

US 2012/0080609 A1    Apr. 5, 2012

(51) Int. Cl.
*H01J 37/147*       (2006.01)
*B23P 17/04*        (2006.01)

(52) U.S. Cl. .................................................. 250/396 R
(58) Field of Classification Search .............. 250/396 R, 250/492.1, 492.2, 492.22, 492.3; 313/359.1–363.1
See application file for complete search history.

(56) References Cited

U.S. PATENT DOCUMENTS

| | | | | |
|---|---|---|---|---|
| 4,439,684 A | * | 3/1984 | Hemmerich et al. | 250/396 R |
| 4,714,831 A | * | 12/1987 | Clark et al. | 250/305 |
| 5,369,953 A | * | 12/1994 | Brophy | 60/202 |
| 5,448,883 A | * | 9/1995 | Meserole et al. | 60/202 |
| 5,449,920 A | * | 9/1995 | Chan | 250/492.21 |
| 5,659,225 A | * | 8/1997 | Tsuruoka et al. | 313/414 |
| 6,153,970 A | * | 11/2000 | Chen et al. | 313/412 |
| 6,194,822 B1 | * | 2/2001 | Yeh et al. | 313/409 |
| 6,318,069 B1 | * | 11/2001 | Falce et al. | 60/202 |
| 6,407,399 B1 | * | 6/2002 | Livesay | 250/492.3 |
| 6,590,324 B1 | * | 7/2003 | Kanarov et al. | 313/360.1 |
| 6,628,061 B2 | * | 9/2003 | Hong et al. | 313/446 |
| 6,707,244 B2 | * | 3/2004 | Kimiya et al. | 313/414 |
| 6,759,807 B2 | * | 7/2004 | Wøhlin | 315/111.21 |
| 6,864,485 B2 | * | 3/2005 | Kahn et al. | 250/396 R |
| 7,285,788 B2 | | 10/2007 | Lee et al. | |
| 7,405,415 B2 | * | 7/2008 | Shang | 250/492.3 |
| 7,414,355 B2 | * | 8/2008 | Kanarov et al. | 313/238 |

(Continued)

FOREIGN PATENT DOCUMENTS

JP    2000-011905 A    1/2000

OTHER PUBLICATIONS

Tartz, M., Thrust-vector tilting caused by grid misalignment, 27th International Electric Propulsion Conference, Pasadena, CA, Oct. 15-19, 2001.*

(Continued)

*Primary Examiner* — Robert Kim
*Assistant Examiner* — Wyatt Stoffa
(74) *Attorney, Agent, or Firm* — HolzerIPLaw, PC

(57) ABSTRACT

A grid assembly coupled to a discharge chamber of an ion beam source is configured for steering ion beamlets emitted from the discharge chamber at circularly asymmetrically determined steering angles. The grid assembly includes at least first and a second grid with a substantially circular pattern of holes, wherein each grid comprises holes positioned adjacent to one another. A plurality of the holes of the second grid is positioned with offsets relative to corresponding holes in the first grid. Due to the offsets in the holes in the second grid, ions passing through the offset holes are electrostatically attracted towards the closest circumferential portion of the downstream offset holes. Thus, the trajectories of ions passing through the offset holes are altered. The beamlet is steered by predetermined asymmetric angles. The predetermined steering angles are dependent upon the hole offsets, voltage applied to the grids, and the distance between the grids.

58 Claims, 6 Drawing Sheets

U.S. PATENT DOCUMENTS

| | | | |
|---|---|---|---|
| 7,564,042 B2* | 7/2009 | Lee et al. | 250/396 R |
| 7,629,589 B2* | 12/2009 | Hwang et al. | 250/396 R |
| 7,714,287 B1* | 5/2010 | James et al. | 250/310 |
| 7,716,021 B2 | 5/2010 | Kameyama et al. | |
| 8,053,747 B2* | 11/2011 | Abarra et al. | 250/492.21 |
| 2002/0074508 A1* | 6/2002 | Kahn et al. | 250/423 R |
| 2003/0184206 A1* | 10/2003 | Kanarov et al. | 313/360.1 |
| 2004/0212288 A1* | 10/2004 | Kanarov et al. | 313/361.1 |
| 2005/0211926 A1* | 9/2005 | Ito et al. | 250/492.21 |
| 2005/0242302 A1* | 11/2005 | Platzgummer et al. | 250/492.22 |
| 2006/0017011 A1* | 1/2006 | Shang | 250/492.1 |
| 2006/0152164 A1* | 7/2006 | Lee et al. | 315/111.31 |
| 2006/0192132 A1* | 8/2006 | Kanarov et al. | 250/396 R |
| 2007/0181820 A1* | 8/2007 | Hwang et al. | 250/396 R |
| 2008/0073583 A1* | 3/2008 | Jasinski et al. | 250/492.21 |
| 2008/0164819 A1 | 7/2008 | Hwang et al. | |
| 2010/0219740 A1* | 9/2010 | Davis et al. | 313/360.1 |
| 2011/0001057 A1* | 1/2011 | Stresau et al. | 250/396 R |

OTHER PUBLICATIONS

Okumura, Y., "Experimental study of ion beamlets steering by aperture displacement in two-stage accelerator," Rev. Sc. Instrum. 51(4) Apr. 1980.*

"Dual ion-beam system deposits ultra-low-loss mirrors," LaserFocusWorld; http://www/optoiq.com/index/photonics-technologies-applications.lfg-display/lfw-articles-tools-template.articles.laser-focus-worls.volume-40.issue-11.features.film-coatings.dual-ion-beam-system-deposits-ultra-low-loss-mirrors.html, downloaded Aug. 30, 2010, 7 pages.

"Fundamentals of Ion Beam Sputtering," http://home-earthlink.net/~chutko/fundam.htm; downloaded Sep. 3, 2010, 6 pages.

Homa, "NASA, Ion Beamlet Steering for Two-Grid Electrostatic Thrusters," NASA CR-174671, Jul. 1984, 83 pages.

Kameyama, "A successful example of numerical simulations in cost-effective sputter deposition system design," Veeco Ion Beam Equipment, Inc., Fort Collins, Colorado, 2005, 4 pages.

Kaufman et al., "Operation of Broad-Beam Sources," Commonwealth Scientific Corporation, Alexandria, Virginia, 1984, pp. 33-53.

Mahoney et al., "Broad-area Ion Beam Systems for Material Processing: An Overview of Technology and Applications," 36th International Conference on Metallurgical Coatings and Thin Films; Apr. 29, 2009, San Diego, California, 36 pages.

Mahoney, "Rotational Sputter Targets for Ion Beam Assisted Deposition," Mar. 2011.

Siegfried, "Veeco Broad-beam Ion Grid Systems," Mar. 2011.

International Searching Authority, International Search Report, PCT/US2011/054800, dated May 4, 2012, 3 pages.

International Searching Authority, Written Opinion, PCT/US2011/054800, dated May 4, 2012, 4 pages.

International Searching Authority, International Search Report, PCT/US2011/054759, dated Apr. 26, 2012, 3 pages.

International Searching Authority, Written Opinion, PCT/US2011/054759, dated Apr. 26, 2012, 3 pages.

International Searching Authority, International Search Report, PCT/US2011/054902, dated Apr. 27, 2012, 3 pages.

International Searching Authority, Written Opinion, PCT/US2011/054902, dated Apr. 27, 2012, 3 pages.

* cited by examiner

GRID PROVIDING BEAMLET STEERING

CROSS-REFERENCE TO RELATED APPLICATIONS

The present application is related to U.S. patent application Ser. No. 12/898,281, entitled "Ion Beam Distribution" and filed on Oct. 5, 2010 and U.S. patent application Ser. No. 12/898,424, entitled "Plume Steering" and filed on Oct. 5, 2010, which are specifically incorporated by reference herein for all they disclose or teach.

BACKGROUND

Ion sources may be used to propel ions toward a work piece, such as substrate or a sputter target, typically in the form of an ion beam. In an etching operation, the ions are intended to collide with and thereby etch away material on a work piece surface. In a sputtering operation, the ions collide with target material mounted on a base plate, causing atoms of the material to leave the target surface in a plume. Therefore, the plume may be directed to coat the surface of a substrate or other work piece with atoms of the target material.

During a sputtering operation, an ion beam sputters target material from the target surface, causing areas of the target material to thin or wear away. However, the sputtering rate over the surface of the target material is typically non-uniform, causing the target to wear away unevenly. When the ion beam sputters away enough target material to reach a certain depth in at least one area on the target, subsequent operation can risk sputtering all the way through the target material in that area to reach the base plate and/or an adhesive fixing the target material to the base plate. If the ion beam sputters all the way through the target material, the adhesive and/or the base plate material may be sputtered to the substrate, thereby contaminating the substrate. Accordingly, a sputtering operation on a particular target is typically terminated before any area of the target material is completely worn through, at which point the target is discarded or recycled. As such, the useful lifecycle of a target material is limited by the target area experiencing the maximum sputter rate.

SUMMARY

A method propels a plurality of ion beamlets from a grid with a substantially circular pattern of holes in a circularly asymmetric distribution of steering angles. In another implementation, a method of manufacturing forms a grid with a substantially circular pattern of holes configured to propel a plurality of ion beamlets from the grid in a circularly asymmetric distribution of steering angles. In another implementation, a system comprises a discharge chamber adapted to emit an ion beam comprising a plurality of ion beamlets. The system further comprises a grid assembly coupled to and downstream from the discharge chamber, wherein the grid assembly comprises at least one grid with a substantially circular pattern of holes configured to propel a plurality of ion beamlets from the grid in a circularly asymmetric distribution of steering angles. In another implementation, an apparatus comprises a grid with a substantially circular pattern of holes configured to propel a plurality of ion beamlets from the grid in a circularly asymmetric distribution of steering angles.

BRIEF DESCRIPTIONS OF THE DRAWINGS

A further understanding of the nature and advantages of the present invention may be realized by reference to the figures, which are described in the remaining portion of the specification. In the figures, like reference numerals are used throughout several figures to refer to similar components. In some instances, a reference numeral may have an associated sub-label consisting of a subscript to denote one of multiple similar components. When reference is made to a reference numeral without specification of a sub-label, the reference is intended to refer to all such multiple similar components.

DETAILED DESCRIPTIONS

In the following description, for the purposes of explanation, numerous specific details are set forth in order to provide a thorough understanding of the present invention. It will be apparent, however, to one skilled in the art that the present invention may be practiced without some of these specific details. For example, while various features are ascribed to particular implementations, it should be appreciated that the features described with respect to one implementation may be incorporated with other implementations as well. By the same token, however, no single feature or features of any described implementation should be considered essential to the invention, as other implementations of the invention may omit such features.

Figure 1:
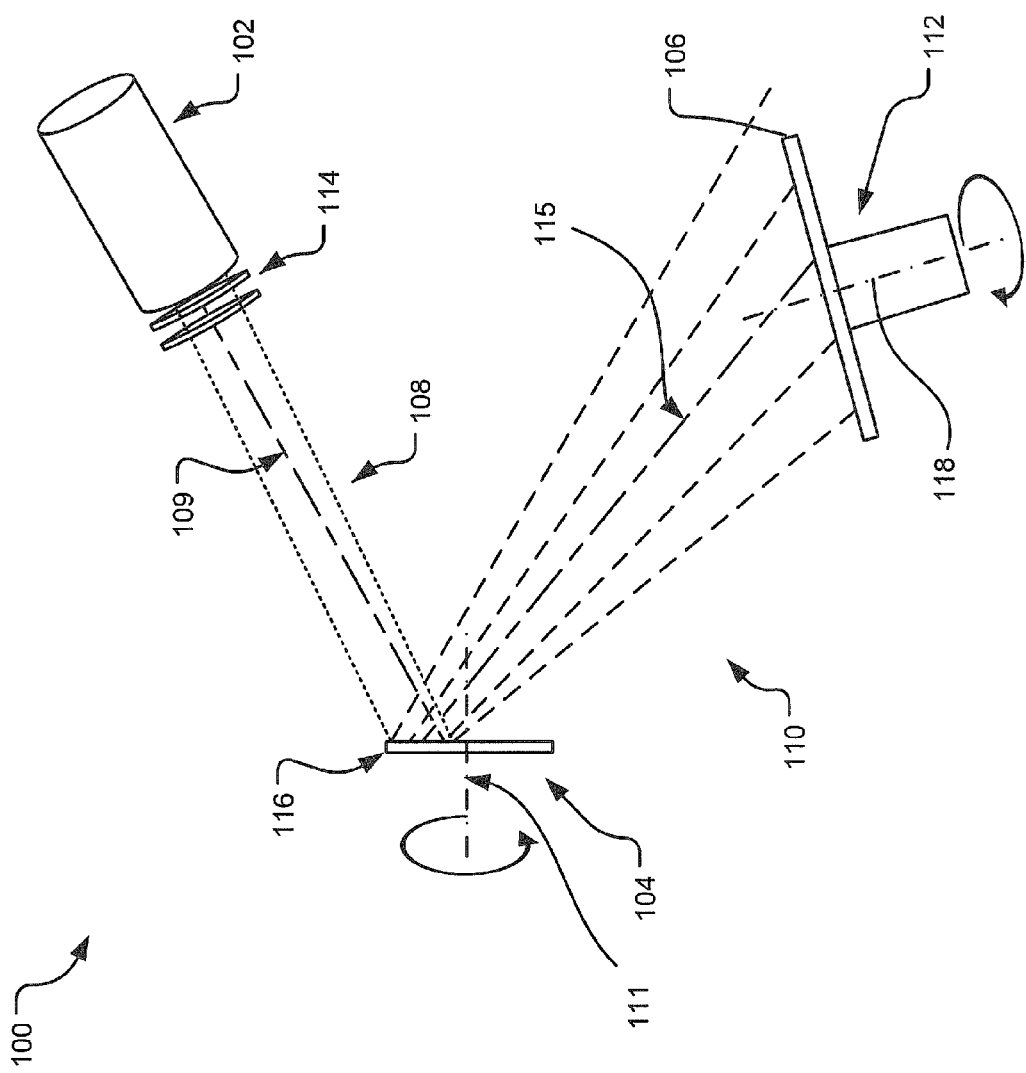
FIG. 1 illustrates an example block diagram of an ion beam system.

FIG. 1 illustrates an example block diagram of a beam steering ion beam system 100. Even though the implementation of the ion beam system 100 is implemented as an ion beam sputter deposition system, components of the ion beam system 100 may also be used with some alteration for implementing an ion beam etch system, an ion implantation system, an ion beam deposition system, an ion beam assisted deposition system, etc.

In the illustrated implementation, the ion beam system 100 includes an ion source 102, a work-piece sub-assembly 104, and a substrate assembly 106. The ion beam source 102 generates an ion beam 108 that includes a plurality of ion beamlets. The ion source 102 has a centerline axis 109 that is targeted or directed toward work-piece sub-assembly 104 such that the ion beam 108 completely or near completely intersects the plan of work-piece sub-assembly 104. The ion beam 108, upon striking the work-piece sub-assembly 104, generates a sputter plume 110 of material from a target affixed to a work-piece surface 116 of the work-piece sub-assembly 104. The ion beam 108 strikes the work-piece sub-assembly 104 at such an angle so that the sputter plume 110 generated from the work-piece sub-assembly 104 travels towards the substrate assembly 106. In one implementation of the ion beam system, the sputter plume 110 is divergent as it travels towards the substrate assembly 106 and may partially overspray substrate assembly 106. However, in an alternate implementation, the sputter plume 100 may be made more or less concentrated so that its resulting deposition of material is more effectively distributed over a particular area of the substrate 106.

The substrate assembly 106 is located such that the sputter plume 110 strikes the substrate affixed to the substrate assembly 106 at a desired angle as well. Note that the substrate assembly may refer to a single large substrate or a sub-assembly holder that holds multiple smaller individual substrates. In one example implementation of the ion beam system 100, the substrate assembly 106 is attached to a fixture 112 that allows the substrate assembly 106 to be rotated or moved in a desired manner, including rotation of substrate assembly 106 about its axis 118 or pivoting the fixture 112 to tilt the substrate assembly axis 118 to alter its angle with respect to the sputter plume 110.

In an implementation where the substrate assembly includes a substrate that is being treated, such a substrate in the substrate assembly 106 may be a single or arrayed batch of substantially planar work-pieces such as wafers or optical lenses. Alternatively, in such implementation where the substrate is being treated, the substrate in the substrate assembly 106 may be a single or arrayed batch of work-pieces that has additional 3D features, such as cubic (or faceted) optical crystals, curved optical lenses or cutting tool inserts, for example. In addition, such work-pieces may be masked with mechanical templates or patterned etch resist layers (i.e. photo-resist) to help facilitate selected patterning of deposited films or ion treatment over the surface areas of the work-pieces.

In one implementation of the ion beam system 100, the ion source 102 generates ions that are positively charged. However, in an alternate implementation, the ion source 102 may generate ions that are negatively charged. The subsequent disclosure herein assumes that the ions generated by the ion source 102 are positively charged. The ion source 102 may be a DC type, a radio frequency (RF) type or a microwave type gridded ion source. In such an implementation, a steering structure including a plurality of grids 114 is positioned in the path of the ion beam 108. In one implementation of the ion beam system 100, grids 114 are used to direct the ion beam 108 on the work-piece sub-assembly 104 in a desired manner. In one implementation of the ion beam system 100, the plurality of grids 114 steer the ion beamlets such that the ion beam 108 is divergent from the centerline axis 109 of the ion source 102 if no bulk ion beam steering was provided. In an alternate implementation, the plurality of grids 114 steers the ion beamlets such that the ion beam 108 is not divergent from the centerline axis 109. Alternate implementation may also be provided. As discussed below in further detail, in an example implementation, the grids 114 cause the ion beam 108 to have a symmetric or asymmetric cross-sectional profile around a beam axis.

In one implementation, the individual holes in the grids 114 may be positioned to yield the highest density of holes per area to maximize ions extracted from the ion source 102. In another implementation, the grids 114 may have a rectilinearly or elliptically shaped pattern of holes. Individual holes in a rectilinear or elliptical shaped acceleration grid may be positioned to steer beamlets in a circularly asymmetric distribution. Further, holes in a rectilinearly shaped acceleration grid may be positioned relative to corresponding holes in a rectilinearly shaped screen grid, wherein each offset provides for individual steering angles. In other words, a first beamlet may pass through a first hole in the acceleration grid at a first steering angle. A second beamlet may pass through a second hole in the acceleration grid, adjacent to the first hole, at a second steering angle different from the first steering angle. A third beamlet may pass through a third hole in the acceleration grid, adjacent to the second hole, at a third steering angle different from the second steering angle.

The work-piece sub-assembly 104 is located on a platform (not shown in FIG. 1) that rotates the work-piece sub-assembly 104 about a given axis 111 of a work-piece surface 116. In the implementation illustrated in FIG. 1, the work-piece surface 116 is positioned in a manner so that the ion beam 108 strikes the work-piece surface 116 asymmetrically. As further illustrated below, such asymmetric alignment of the work-piece surface 116 together with its rotation around its axis allows more uniform application of the ion beam on the work-piece surface 116. In one implementation of the ion beam system 100, the target affixed to the work-piece surface 116 is made of a single material, and multiple work-piece surfaces 116 with different materials may be placed and interchanged so that a layer of materials can be deposited to create multi-layer coatings on the surface of substrates in the substrate assembly 106. Examples of such material to be deposited on the substrates include without limitation metallic, such as silicon (Si), molybdenum (Mo), tantalum (Ta), etc., oxides such as silicon dioxide ($SiO_2$), tantalum pentaoxide ($Ta_2O_5$), titanium dioxide ($TiO_2$), etc, and other compounds.

In the implementation illustrated in FIG. 1, the sputter plume 110 is directed to the substrate assembly 106 so that a centerline 115 of the sputter plume is off a central axis 118 of the substrate assembly 106. Furthermore, the sputter plume 110 may be directed to the sputter assembly 106 such that in one implementation, at least some sputter material is sprayed in area around and away from the substrate assembly 106, resulting in overspray. Note that in the implementation shown in FIG. 1, the sputter plume oversprays the substrate assembly 106; in an alternate implementation, the sputter plume may impinge on an area confined to the surface of the substrate assembly 106. In one implementation, the sputter assembly 106 is designed so that it may be rotated around a central axis 118. In an implementation of the ion beam system 100, the target surface 116 is tilted as to the centerline 109. In an alternate embodiment, the substrate 106 is tilted as to the centerline 115 of the sputter plume.

Figure 2:
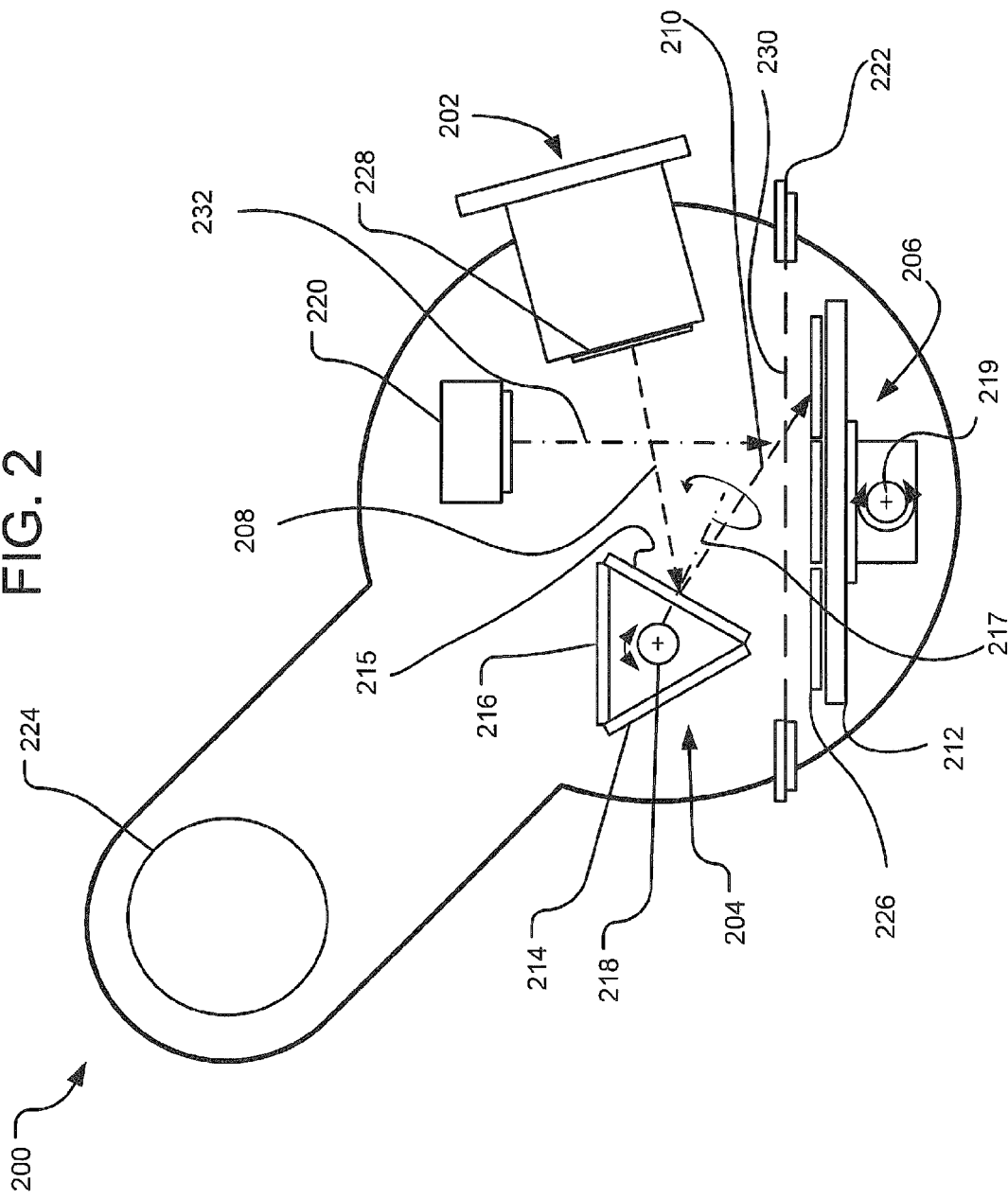
FIG. 2 illustrates an example implementation of a beam steering ion beam system.

FIG. 2 illustrates an example implementation of a beam steering ion beam system. Specifically, FIG. 2 illustrates a top-down view of a dual ion beam system 200. The ion beam system 200 includes a first RF ion source 202, a target assembly 204, and a substrate assembly 206. The substrate assembly may be tilted around an axis 219. The first RF ion-source 202 generates an ion-beam 208 that is directed towards the target assembly 204. The target assembly 204, upon interaction with the ion-beam 208, generates a sputter plume 210 that is used for deposition on a substrate 226 of the substrate assembly 206. The ion beam system 200 may include a chamber door 222 to effect vacuum conditions in the ion beam system 200. In the illustrated implementation, the chamber door 222 is connected to a door assembly 230 used in maintaining vacuum conditions in the ion beam system 200 as necessary. In one implementation, the substrate 226 is made of a single or arrayed batch of substantially planar work-pieces such as wafers or optical lenses. In an alternate implementation, the substrate 226 is made of a single or arrayed batch of work-pieces that may have additional 3D features, such as cubic (or faceted) optical crystals, curved optical lenses or cutting tool inserts, for example. In addition, such work-pieces may be masked with mechanical templates or patterned etch resist layers (i.e. photo-resist) to help facilitate selected patterning of deposited films or ion treatment over the surface areas of the work-pieces.

The target assembly 204 includes a plurality of target surfaces 214, 215, 216. In one implementation of the ion beam system 100, the target assembly 204 is designed to allow the target surfaces 214, 215, 216 to index around an axis 218 to change from one target 215 to another target 214 or 216. In one implementation of the ion beam system 200, each of the target surfaces 214, 215, 216 have a different material on its surface. Alternatively, the same material may be used on all target surfaces 214, 215, 216. In an alternate implementation, the angle of the active target surface 215 is changed to an alternate static angle relative to the ion beam 208 during deposition. Alternatively, the angle of the active target surface 215 can be oscillated over a range of angles during deposition to help distribute wear across the target surface and to improve deposition uniformity. In an alternate implementation, the work-piece 215 may also be rotated around an axis 217. In an alternate implementation, a second RF ion-source 220 is provided to assist the deposition of the sputter plume 210 on the substrate 226. In one implementation of the ion beam system 100, a gating mechanism (not shown) is used to manage the amount and location of the deposition of the sputter plume 210 on the substrate 226. In one example implementation, the second ion source 220 generates an ion beam 232 that is directed toward the substrate assembly 206. Such an assisting ion beam 232 may be used to either pre-clean or pre-heat the surface of the substrate 226. In an alternate implementation, the assisting ion beam 232 is used in combination with the arrival of material from sputter plume 210 to enhance the surface film deposition kinetics (i.e., material deposition, surface smoothing, oxidation, nitridation, etc.) on substrate 226. In an alternate implementation, the assisting ion beam 232 is used to make deposition of sputter material more dense (or packed) and/or to make the deposition surface smoother.

An implementation of the ion beam system 200 is provided with a vacuum system plenum 224 to generate vacuum condition inside the ion beam system 200. The substrate assembly 206 may be provided with a rotating mechanism to effectively generate a planetary-motion substrate 226. The substrate assembly 206 may also be tilted to alternate angles around an axis 219 either statically or dynamically during deposition in order to improve deposition uniformity across the substrate 226. The first RF ion-source 202 may also include a plurality of grids 228 located in the path of the ion-beam 208 to target or direct the ion-beam in a desired manner.

Figure 3:
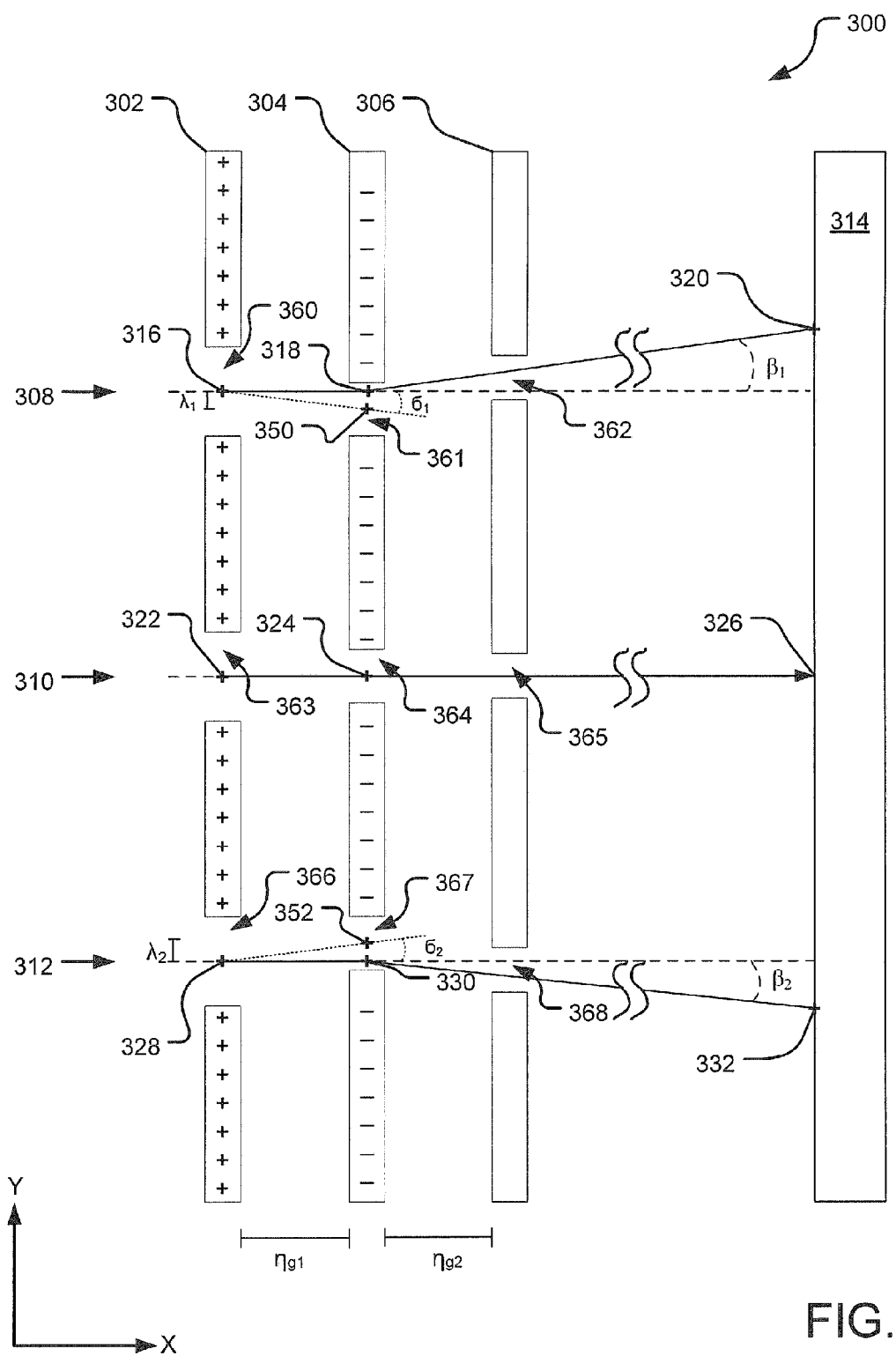
FIG. 3 illustrates an example implementation of a grid assembly of an ion beam system.

FIG. 3 illustrates an example diagram of a grid assembly 300 used in an ion beam system. The grid assembly 300 comprises a screen grid 302, an acceleration grid 304, and a deceleration grid 306 shown in a cross-sectional view, although it should be understood that different combinations of grids may be employed, including configurations employing a larger number or a fewer number of grids. In one implementation, the grids are circular in shape, with each grid having a substantially similar diameter, although other shapes are contemplated. In another implementation, the grids may have a concave or a convex dished shape.

As shown in FIG. 3, the three grids 302, 304, and 306 are positioned parallel to one another with a distance between each grid measured as $\eta_{g1}$ and $\eta_{g2}$. While the grids are shown positioned parallel to one another, this characteristic is not required. In some implementations, the grids may be slightly non-parallel with slightly varying distances $\eta_{g1}$ and $\eta_{g2}$ across the faces of the grids. The grids 302, 304, and 306 are manufactured with an array of corresponding holes. In one implementation, the grids are substantially circular in shape with a substantially circular array of holes, although other grid shapes and hole arrays are contemplated, for example rectangular and elliptical. The grids 302, 304, and 306 are positioned such that the screen grid 302 forms the downstream boundary of a discharge chamber of an ion source (not shown). The discharge chamber generates a plasma of positively charged ions (e.g., from a noble gas, such as argon), and the grids 302, 304, and 306 extract and accelerate ions from the plasma through the grid holes toward a work piece 314 (e.g., a sputter target or substrate). In one implementation, the work piece 314 may be a single or arrayed batch of substantially planar substrates such as wafers or optical lenses or, alternatively, a single or arrayed batch of work pieces that may have additional 3D features, such as cubic (or faceted) optical crystals, curved optical lenses or cutting tool inserts, for example. In addition, such work pieces may be masked with mechanical templates or patterned etch resist layers (i.e. photoresist) to help facilitate selected patterning of deposited films or ion treatment over the surface areas of the work pieces.

Three holes for each grid are shown to illustrate how beamlet steering is achieved for various grid holes that may be applied across the grid assembly system. The work piece 314 may be oriented at an angle relative to the grids 302, 304, and 306. The ions are organized in a collimated ion beam made up of individual beamlets, wherein a beamlet comprises ions accelerating through individual sets of corresponding holes in the grids 302, 304, and 306.

In practice, individual ions of each beamlet flood generally along a center axis through a hole in the screen grid 302 in a distribution across the open area of the hole. The beamlet ions continue to accelerate toward the acceleration grid 304, flooding generally along a center axis through a corresponding hole of the acceleration grid 304. Thereafter, the momentum imparted by the acceleration grid 304 on the beamlet ions propels them generally along a center axis through a hole in the deceleration grid 306 in a distribution across the open area of the hole and toward a downstream positioned work piece 314.

The screen grid 302 is closest to the discharge chamber and is therefore the first grid to receive the emission of ions from the discharge chamber. As such, the screen grid 302 is upstream of the acceleration grid 304 and the deceleration grid 306. The screen grid 302 comprises a plurality of holes strategically formed through the grid. All of the holes in the screen grid 302 may have the same diameter or may have varying diameters across the face of the screen grid 302. Additionally, the distance between the holes may be the same or of varying distances. The screen grid 302 is illustrated in FIG. 3 as four vertical bars in a single column separated by spaces representing three drilled holes 360, 363, and 366 within the screen grid 302. The screen grid 302 is marked with plus (+) signs, representing the screen grid 302 as being positively charged or biased.

The acceleration grid 304 is positioned immediately downstream of the screen grid 302 in FIG. 3, separated by a distance $\eta_{g1}$. As such, the acceleration grid 304 is downstream of the discharge chamber and the screen grid 302 and upstream of the deceleration grid 306. The acceleration grid 304 comprises a plurality of holes strategically drilled through the grid, each hole generally corresponding to a hole in the screen grid 302. Although holes are often formed by drilling, they may also be formed by other methods or combinations of methods including but not limited to milling, reaming, electro discharge machining (EDM), laser machining, water jet cutting and chemical etching. In one implementation, both the acceleration grid 304 and the screen grid 302 include the same number of holes. However, additional implementations may provide for a differing number of holes between the acceleration grid 304 and the screen grid 302. All of the holes in the acceleration grid 304 may have the same diameter or may have varying diameters across the face of the acceleration grid 304. Additionally, the distance between the holes may be the same or of varying distances. The acceleration grid 304 is illustrated in FIG. 3 as four vertical bars in a single column separated by spaces representing three drilled holes 361, 364, and 367 within the acceleration grid 304. The acceleration grid 304 is marked with minus (−) signs, representing that the acceleration grid 304 as being negatively charged or biased. A negative charge or bias on the acceleration grid 304 extracts the ions from the plasma and through the holes in the screen grid 302.

The deceleration grid 306 is positioned immediately downstream of the acceleration grid 304 in FIG. 3, separated by a distance $\eta_{g2}$. As such, the deceleration grid 306 is downstream of the discharge chamber, the screen grid 302 and the acceleration grid 304 and upstream of the work piece 314. The deceleration grid 306 comprises a plurality of holes strategically drilled through the grid, each hole generally corresponding to a hole in the acceleration grid 304. In one implementation, both the deceleration grid 306 and the acceleration grid 304 include the same number of holes. However, additional implementations may provide for a differing number of holes between the acceleration grid 304 and the deceleration grid 306. All of the holes in the deceleration grid 306 may have the same diameter or may have varying diameters across the face of the deceleration grid 306. Additionally, the distance between the holes may be the same or of varying distances. The deceleration grid 304 is illustrated in FIG. 3 as four vertical bars in a single column separated by spaces representing three drilled holes 362, 365, and 368 within the deceleration grid 306. The deceleration grid 306 is typically grounded or charged with a small negative potential or bias.

As ions pass through holes in the deceleration grid 306, the ions collide into the downstream positioned work piece 314, such as a sputter target or substrate. While the work piece 314 is shown parallel to the grids 302, 304, 306 it may also be at any arbitrary angle suitable for a particular application. In a sputtering operation, it is possible to use multiple sputter targets, wherein each target may have a different material affixed to its surface. As ions collide with the surface of a target, an amount of material from the target separates from the surface of the target, traveling in a plume toward another work piece, such as a substrate to coat the surface of a substrate (not shown). With multiple targets of differing material coats, multi-layer coatings may be created onto a single substrate.

FIG. 3 shows three ions 308, 310, and 312 passing through adjacently positioned holes in the three grids 302, 304, and 306 and colliding into the surface of the work piece 314. However, it should be understood that the three ions 308, 310, and 312 generally represent a distribution of ions flooding through the holes in the three grids 302, 304, and 306. The trajectory of the representative ion 308 is altered (e.g., in an upward direction) as the ion 308 approaches and passes through the hole 361 of the acceleration grid 304. The altered trajectory results from an offset in the hole 361 of the acceleration grid 304 relative to the adjacent hole 360 in the screen grid 302, which causes the ion 308 to travel closer to the top circumference of the acceleration grid hole 361. In this configuration, the ion 308 experiences a greater electrostatic attraction to the top circumference of the acceleration grid hole 361 as compared to the bottom circumference, which alters the trajectory of the ion 308 relative to an orthogonal center axis 350 through the acceleration grid hole 361.

In contrast, the trajectory of the ion 312 is altered in the opposite direction (e.g., downward) as the ion 312 approaches and passes through the hole 367 of the acceleration grid 304. The hole 367 of the acceleration grid 304 is also offset relative to the adjacent hole 366 of the screen grid 302. As with ion 308, the altered trajectory of ion 312 results from an intentional offset in the hole 367 of the acceleration grid 304 relative to the adjacent hole 366 in the screen grid 302, which causes the ion 312 to travel closer to the bottom circumference of the acceleration grid hole 367. In this configuration, the ion 312 experiences a greater electrostatic attraction to the bottom circumference of the acceleration grid hole 367 as compared to the top circumference, which alters the trajectory of the ion 312 relative to an orthogonal center axis 352 through the acceleration grid hole 367.

In contrast to the preceding examples of intentionally altered trajectories, the trajectory of ion 310 remains on the center axis 324 of the hole 364 of the acceleration grid 304. The trajectory of the ion 310 is unaltered because the hole 364 of the acceleration grid 304 is centered (e.g., no offset) relative to the hole 363 of the screen grid 302. In other words, the center axis (i.e., the centerline of the hole) 324 of the hole 364 of the acceleration grid 304 has the same Y-axis location as the center axis 322 of the hole 363 of the screen grid 302. The following paragraphs provide details of the alteration of an ion's trajectory as it passes through the three grids 302, 304, and 306. It is noted, that while FIG. 3 refers to offsets in the X-Axis and Y-Axis plane, the offsets may also exist in a Y-Axis and Z-Axis (not shown) plane.

As stated above, some of the holes in the acceleration grid 304 are offset relative to the adjacently positioned holes in the screen grid 302. In other words, the center axis from one of the holes in the acceleration grid 304 may be offset from the center axis from a corresponding hole of the screen grid 302. The trajectory of ion 308 illustrates an example where the hole 361 of the acceleration grid 304 is offset relative to the adjacent hole 360 of the screen grid 302. A screen grid center axis 316 of the hole 360 in the screen grid 302 has a different Y-axis location compared to an acceleration grid center axis 350 of the hole 361 of the acceleration grid 304. In this example, $\lambda_1$ represents the Y-axis distance between the screen grid center axis 316 and the acceleration grid center axis 350. Further, $\sigma_1$ represents the offset angle of the acceleration grid center axis 350 relative to the screen grid center axis 316, based on the grid separation $\eta_{g1}$.

In the illustrated implementation, location 318 illustrates the Y-axis location where the ion 308 passes through the hole 361 of the acceleration grid 304. In this example, location 318 is offset above the acceleration grid hole center axis 350 by a distance of $\lambda_1$. As the ion 308 approaches location 318, the negatively charged acceleration grid 304 electrostatically attracts the positively charged ion 308 towards the closest circumferential portion of the hole 361 of the acceleration grid. In result, the trajectory of the ion 308 is altered or steered in an upward direction as represented by the solid line extending to the work piece 314. The dashed line represents the unaltered trajectory of the ion 308 if the ion was not electrostatically steered by the intentionally configured offset between the center axes of the holes. In one implementation, as the ion 308 approaches the hole 361 of the acceleration grid 304, the electrostatic attraction begins to increase to a maximum point when the ion 308 is within the hole 361 of the acceleration grid 304. Additionally, as the ion 308 passes through the hole 361 of the acceleration grid 304 the electrostatic attraction diminishes.

Next, the ion 308 passes through the hole 362 of the deceleration grid 306. As stated above, the deceleration grid can be grounded with a neutral charge or zero electrical potential. Therefore, the deceleration grid does not substantially alter the trajectory of the ion 308, as the ion 308 passes through the hole 362 of the deceleration grid 306. In one implementation, the diameter of the hole 362 of the deceleration grid 306 is only marginally larger than the diameter of the ion beamlet exiting the acceleration grid 304. In another implementation, the hole 362 of the deceleration grid 306 is positioned such that the ion 308 passes through the center of the hole 362.

After the ion 308 passes through the hole 362 of the deceleration grid 306, the ion 308 collides into the surface of the work piece 314 at location 320. As previously stated, the dashed line represents the unaltered trajectory of the ion 308 if the ion was not electrostatically steered to alter its trajectory from the center axis 316 of the screen grid 302. A beam deflection angle, $\beta_1$, represents the angle between the centerline of a beamlet of ions with an altered trajectory and the centerline of a beamlet of ions with an unaltered trajectory. In other words, angle $\beta_1$ represents the steering angle of a beamlet relative to a non-steered beamlet.

The above example, illustrates the trajectory of a single ion 308. However, a single stream of ions, known as an ion beamlet, passes through the apertures of the group of holes 360, 361, and 362 of the three grids in a distribution across the open area of the holes. Accordingly, the position of each ion may vary slightly from the position of the ion 308. As such, the overall trajectory of successive ions may also vary slightly from the trajectory of ion 308. Further, the location where successive ions collide into the work piece 314 may also vary slightly.

The ion 310 is illustrated as passing through the apertures of the group of holes 363, 364, and 365 in the grid assembly 300. The ion 310 first passes through the hole 363 at the screen grid hole center axis 322. Next, the ion 310 passes through the hole 364 of the acceleration grid 304 at the acceleration grid hole center axis 324. In this example, the acceleration grid hole center axis 324 is aligned with the screen grid hole center axis 322. In other words, there is no substantial or intentional Y-axis differential or offset between the center axis of the holes 363, 364, and 365 of the screen grid 302 and the acceleration grid 304. Since the acceleration grid hole center axis 324 is as aligned with the screen grid hole center axis 322, there is no dominant lateral electrostatic attraction from the acceleration grid 304. Therefore, the trajectory of ion 310 remains unaltered as the ion passes through the hole 364 of the acceleration grid 304.

The ion 312 is illustrated as passing through the apertures of the group of holes 366, 367, and 368 in the grid assembly 300. In this example, the ion 312 first passes through the hole 366 of the screen grid 302. The screen grid hole center axis 328 represents the center of the hole 366 of the screen grid 302. The center axis 352 of the hole 367 of the acceleration grid 304 is offset relative to the center axis 328 of the hole 366 of the screen grid 302. As such, the acceleration grid hole center axis 352 of the hole 367 in the acceleration grid 302 has a different Y-axis location compared to the screen grid hole center axis 328 of the hole 366 of the screen grid 302. In this example, $\lambda_2$ represents the Y-axis distance between the screen grid hole center axis 328 and the acceleration grid hole center axis 352. $\sigma_2$ represents the offset angle of the acceleration grid hole center axis 352 relative to the screen grid hole center axis 328.

In the illustrated implementation, location 330 illustrates the Y-axis location where the ion 312 passes through the hole 367 of the acceleration grid 304. In this example, location 330 is offset below the acceleration grid hole center axis 352 by a distance of $\lambda_2$. As the ion 312 approaches location 330, the negatively charged acceleration grid 304 electrostatically attracts the positively charged ion 312 towards the closest circumferential portion of the hole 367 of the acceleration grid 304. In result, the trajectory of the ion 312 is altered or steered in an downward direction as represented by the solid line extending to the work piece 314. The dashed line represents the unaltered trajectory of the ion 312 if the ion was not electrostatically steered by the intentionally configured offset between the center axes of the holes. In one implementation, as the ion 312 approaches the hole 367 of the acceleration grid 304, the electrostatic attraction begins to increase to a maximum point when the ion 312 is within the hole 367 of the acceleration grid 304. Additionally, as the ion 312 passes through the hole 367 of the acceleration grid 304 the electrostatic attraction diminishes.

Next, the ion 312 passes through the hole 368 of the deceleration grid 306. As stated above, the deceleration grid can be grounded or charged with small negative potential or bias. Therefore, the deceleration grid does not substantially alter the trajectory of the ion 312, as the ion 312 passes through the hole 368 of the deceleration grid 306. In one implementation, the diameter of the hole 368 of the deceleration grid 306 is only marginally larger than the diameter of the ion beamlet. In another implementation, the hole 368 of the deceleration grid 306 is positioned such that the ion 312 passes through the center of the hole 368.

After the ion 312 passes through the hole 368 of the deceleration grid 306, the ion 312 collides into the surface of the work piece 314 at location 332. As previously stated, the dashed line represents the unaltered trajectory of the ion 312 if the ion was not electrostatically steered to alter its trajectory from the center axis 328 of the screen grid 302. A beam deflection angle, $\beta_2$, represents the angle between the centerline of a beamlet of ions with an altered trajectory and the centerline of a beamlet of ions with an unaltered trajectory. In other words, angle $\beta_2$ represents the steering angle of a beamlet relative to a non-steered beamlet.

A maximum deflection or steering angle of a beamlet exists resulting in a maximum distance the trajectory of a beamlet can be altered as the ions collide into the work piece 314. For beamlet steering using either a two or three grid assembly, the range of deflection angle is typically between 0 and 10 degrees in general practice, above which energetic ion impingement of the accelerator grid 304 by ions at the periphery of the beamlet can become a grid design or performance consideration. However, angles outside of this range are contemplated.

In one implementation, it is possible to include one or more grids downstream of the acceleration grid 304 with appropriate hole size, relative offset and voltage settings to further increase the net steering angle of a beamlet. For example, in one implementation, a fourth grid (not shown) may be positioned between the acceleration grid 304 and the deceleration grid 306 to further alter or steer a beamlet (e.g., beyond the range of a steering angle of a three-grid assembly). In order to extend the range of the steering angle of a beamlet, the fourth grid includes a hole positioned adjacent to and yet offset from the adjacent hole from the acceleration grid 304. Further, the fourth grid may have the opposite charge polarity of ions passing through the hole. Once an ion passes through a hole in the acceleration grid 304, the ion approaches the corresponding hole in the fourth grid. The offset of the hole in the fourth grid is positioned to further attract the ion in substantially the same direction as the adjacent hole from the acceleration grid 304. Therefore, the trajectory of the ion can be further steered beyond the range of a steering angle of a three-grid assembly. In another implementation, additional grids may be used in various combinations to further increase the range of a steering angle of a four-grid assembly or to otherwise alter the trajectories of individual beamlets.

A number of factors influence the maximum deflection or steering angle of an ion beamlet as it approaches and passes through a hole of the acceleration grid 304. As previously stated, the Y-axis distance ($\lambda$) between a screen grid hole center axis and an acceleration grid hole center axis affects the steering of an ion beamlet. In other words, the greater the distance $\lambda$, the more an ion beamlet may be steered. Additionally, the distance ($\eta_{g1}$) between a screen grid and an acceleration grid affects the steering of an ion beamlet. The voltage applied to the acceleration grid also affects the steering an ion beamlet. In one implementation, the voltage applied to the screen grid may between 50 volts (V) and 10 kilovolts (kV). The voltage applied to the acceleration grid may be between −50V and −10 kV.

An electric field is present on both the upstream side and downstream side of the acceleration grid 304. For example, the electric field on the upstream side of the acceleration grid 304 is a voltage differential divided by the distance ($\eta_{g1}$) between the screen grid 302 and the acceleration grid 304. In one implementation, a formula for determining an amount of steering of an ion beamlet (e.g., beam deflection or steering angle $\beta$) is:

$$\beta \approx (-\lambda/4\eta_{g1})(1-(E_2/E_1))$$

In this formula, the unit of measurement for $E_1$ and $E_2$ is volts/mm. $E_1$ is calculated as [(voltage of the screen grid−voltage of the acceleration grid)/$\eta_{g1}$]. $E_2$ is calculated as [(voltage of the acceleration grid−voltage of the deceleration grid)/$\eta_{g2}$]. $\lambda$ is a measure of the distance between the screen grid center axis and the acceleration grid center axis. $\eta_{g1}$ is a measure of the lateral distance between the screen grid and the acceleration grid. $\eta_{g2}$ is a measure of the lateral distance between the acceleration grid and the deceleration grid. It is noted that the above formula is but one example for calculating a beam deflection angle. Other formulae may be used to arrive at a predetermined beam deflection angle. Further, some variables may be omitted or additional variables added to a formula. In one implementation, the thickness of one or more grids may be considered in a formula for calculating a beam deflection angle.

Figure 4:
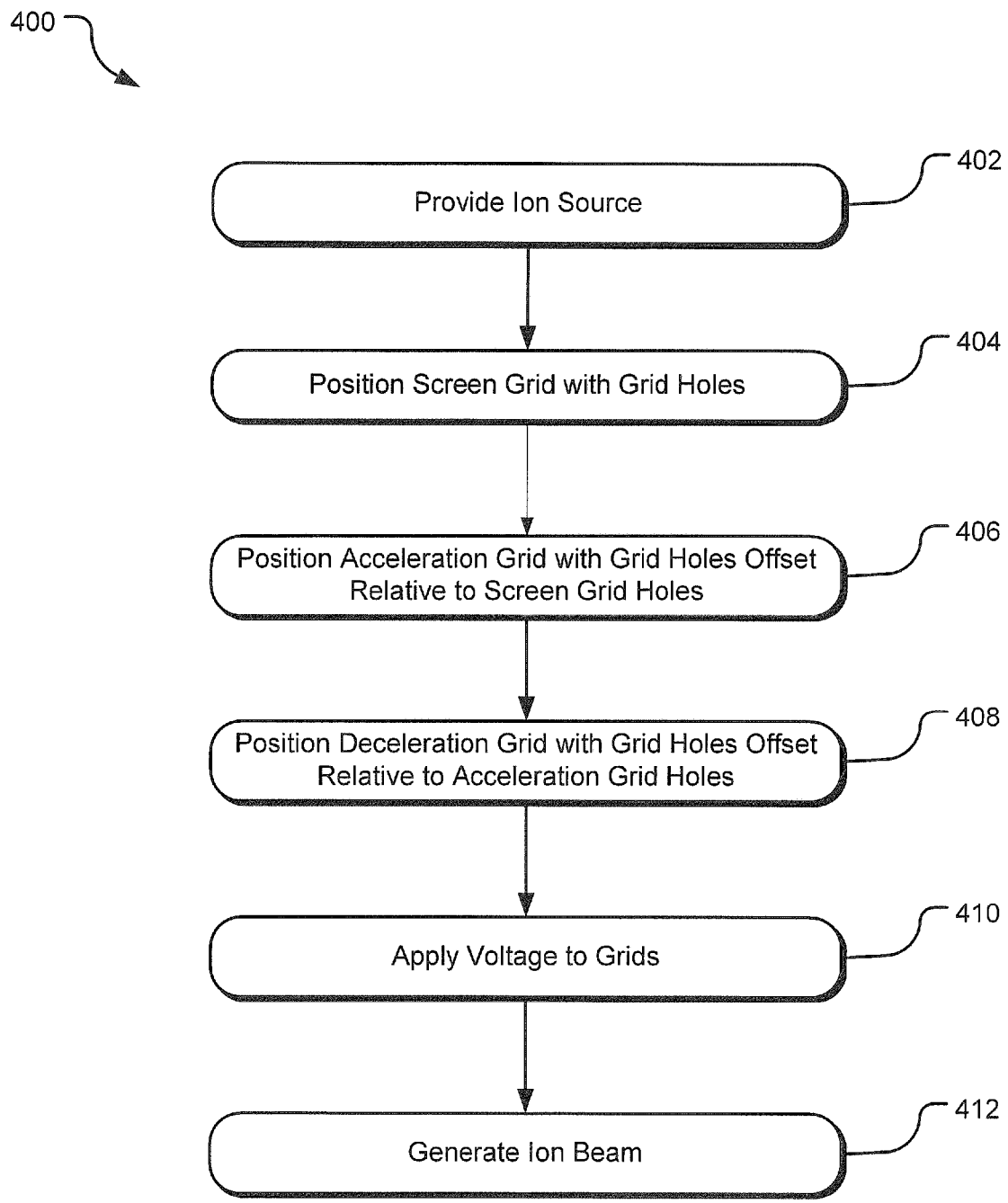
FIG. 4 illustrates an example flowchart for steering an ion beamlet from an ion source.

FIG. 4 illustrates an example flowchart 400 for steering an ion beamlet from an ion source. A generating operation 402 provides an ion source configured within a discharge chamber to emit a plurality of ions towards a grid assembly. A positioning operation 404 couples a screen grid downstream from or adjacent to a discharge chamber, which provides the ions.

The screen grid comprises a plurality of holes formed within the grid. In one implementation, the screen grid is mounted and positioned generally perpendicular to the flow of ions as the ions are emitted from the discharge chamber of the ion source. In one implementation, the individual holes in the screen grid may be positioned to yield a circularly asymmetric steering of ion beamlets from an ion source.

In another implementation, adjacent holes along any given radius of one of the grids of a grid assembly may yield circularly asymmetric steering angles having equal magnitudes. A set of offsets between corresponding holes in two or more grids with a substantially circular pattern of holes is one possible structure for steering ion beamlets in a circularly asymmetric distribution. A set of offsets between corresponding holes in two or more grids with a substantially circular pattern of holes is one possible structure for steering ion beamlets in a circularly asymmetric distribution.

Further, dishing of one or more of the ion beam grids is another possible structure for steering the ion beamlets in a circularly asymmetric distribution. Still further, a combination of offsets and dishing is yet another possible structure for steering the ion beamlets in a circularly asymmetric distribution. In this implementation, an overall beamlet steering becomes a superposition of grid hole offset effects, as described above, and dishing effect. In such an implementation, the beamlet steering angle may be a measure of the angle between the altered and unaltered trajectories of beamlets by a grid hole offset. The overall steering angle may be a measure of the angle between the altered trajectory of the beamlet and a centerline of the ion source.

Another positioning operation 406 positions an acceleration grid downstream from the screen grid. In one implementation, the acceleration grid comprises the same number of holes as the screen grid. In this implementation, each of the holes of the acceleration grid are positioned either 1) substantially aligned with a corresponding hole of the screen grid; or 2) offset from alignment with a corresponding hole in the screen grid, wherein an offset angle between the centers of the acceleration grid hole and screen grid hole exists. The diameter of the acceleration grid may be substantially the same as the diameter of the screen grid and the ion source, although the diameters may vary in certain implementations. The distance between the acceleration grid and the screen grid may also vary in different implementations. In one implementation, the distance is between 0.5 mm and 2 mm; however, smaller or larger distances may be used.

Another positioning operation 408 positions a deceleration grid downstream from the acceleration grid. In one implementation, the deceleration grid comprises the same number of holes as both the screen grid and the acceleration grid. In this implementation, each of the holes of the deceleration grid are positioned either 1) substantially aligned with a corresponding hole of the acceleration grid; or 2) offset from alignment with a corresponding hole in the acceleration grid, wherein an offset angle between the centers of the deceleration grid hole and acceleration grid hole exists. The diameter of holes of the deceleration grid may be substantially the same as the diameter of holes of the screen grid and the ion source, although the diameters may vary in certain implementations. The distance between the deceleration grid and the acceleration grid may also vary in different implementations. In one implementation, the distance is between 0.5 mm and 2 mm; however, smaller or larger distances may be used. In one implementation, the distance between the acceleration grid and the deceleration grid may be the same as the distance between the screen grid and the acceleration grid. In another implementation, the distances between each of the grids may vary.

A charging operation 410 applies voltages to the screen and acceleration grids. The electrical voltage applied to the acceleration grid has an opposite polarity of the charge of the ions emitted from the ion source while the electrical voltage applied to the screen grid has the same polarity of the charge of the ions. As stated above, the levels of voltages applied to the screen grid and the acceleration grid influence the amount of steering of ions passing through holes in the acceleration grid.

An accelerating operation 412 generates an ion beam from the ion source, wherein the ion beam comprises a plurality of streams of ions (e.g., beamlets). As the ions move towards the grid assembly, some of the ions travel toward the surface of the screen grid, where those ions are blocked by the screen grid. Other ions (e.g., target bound ions) pass through the holes in the screen grid. Some of the target bound ions further pass through corresponding holes of both the acceleration grid and the deceleration grid along the center axes of the corresponding holes in each grid (e.g., without the trajectory of the target bound ions being altered). Other target bound ions pass through holes in the acceleration grid wherein each of the acceleration grid holes is offset relative to the adjacent holes in the screen grid. As such, each of the beamlets associated with these ions steers towards the closest circumferential portion of each hole in the acceleration grid. Therefore, the trajectory of each remaining target bound ion is altered or steered by an electrostatic attraction caused by the acceleration grid. Once the target bound ions pass through holes in the acceleration grid, the electrostatic attraction from the acceleration grid diminishes and the trajectory of each ion is not substantially altered. Next, the remaining target-bound ions pass through adjacent holes in the deceleration grid. The deceleration grid is typically grounded with a neutral charge or zero electrical potential. Thus, the trajectories of the remaining target-bound ions are not substantially altered. The degree of steering of each ion beamlet is called the beamlet deflection angle or the beamlet steering angle.

In another embodiment, the holes of the acceleration grid may be positioned relative to the adjacent holes in the screen grid such that a spatial variation (with respect to grid radius r) in the distribution of steering angles for each ion beamlet propelled from the ion source may be non-monotonic across the radius of the acceleration grid.

Figure 5:
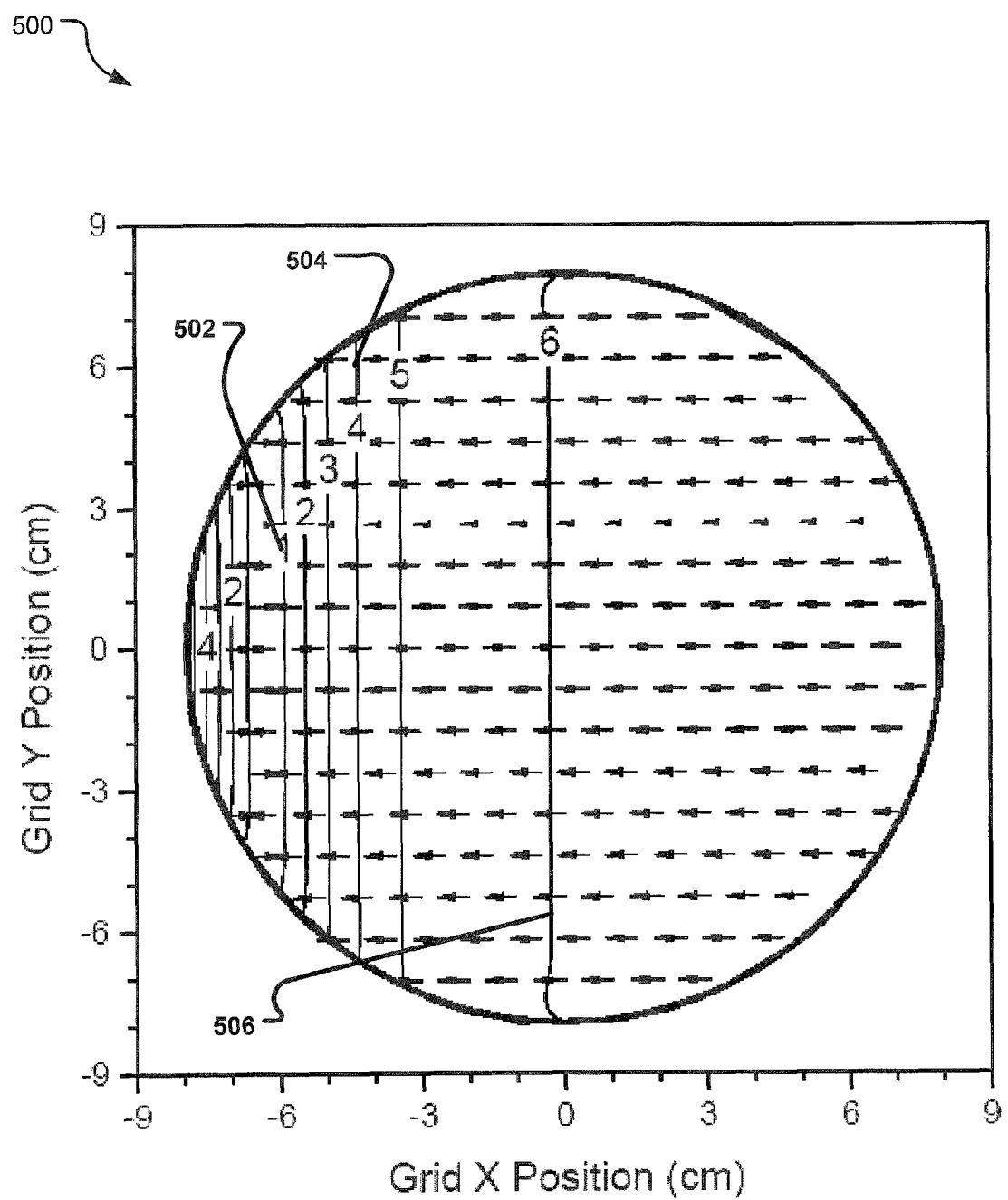
FIG. 5 illustrates an example beamlet steering diagram using hole offsets for steering a single-peak ion beam.

FIG. 5 illustrates an example beamlet steering diagram 500. The beamlet steering diagram 500 illustrates an ion beam cross-section with arrows indicating beamlet steering directions at X-Y locations on the grid surface and numerals (i.e., 1, 2, 3, 4, 5, and 6) indicating beamlet steering magnitude in degrees at X-Y locations on the grid surface.

In this example, beamlets are generally being steered toward the left side of the ion beam exiting the beam grid when facing the grid surface. At an X-Y location 502, the magnitude of steering is one degree. Note that a vertical line passing through location 502 denotes multiple points where the magnitude of steering is one degree. Note also that the arrows reverse direction near location 502, wherein the magnitude of steering is one degree. At an X-Y location 504, the magnitude of steering is four degrees. Note that a vertical line passing through location 504 denotes multiple points where the magnitude of steering is four degree. At an X-Y location 506, the magnitude of steering is six degrees. Note that a vertical line passing through location 506 denotes multiple points where the magnitude of steering is six degree. Thus, beamlet steering diagram 500, in effect, provides a contour plot of the magnitude of beamlet steering at various X-Y locations on the grid surface, together with the direction of such steering as depicted by the arrows.

In the beamlet steering diagram 500, the arrows indicate a generally leftward steering of the beamlets. Additional implementations may permit individual beamlets to be steered in varying directions across an X-Y plane. For example, an upper right portion of beamlets may be steered generally in a downward direction with individual beamlets from the upper right portion being steered at varying steering angles (e.g., 1 degree, 4 degrees, 6 degrees, etc.). A lower left portion of beamlets may be steered generally in an upward direction with individual beamlets from the lower left portion being steered at varying steering angles (e.g., 1 degree, 4 degrees, 6 degrees, etc.). Further, an upper left portion of beamlets' trajectories may remain unaltered, such that no offsets exist between holes in an upper left portion of an acceleration grid relative to holes in an upper left portion of a screen grid. A lower right portion of beamlets may be steered generally in an upper left direction with individual beamlets from the lower right portion being steered at varying steering angles (e.g., 1 degree, 4 degrees, 6 degrees, etc.). It is noted that varying examples may be used to circularly asymmetrically steer beamlets. As such, beamlet steering using hole offsets and grid dishing should not be limited by the illustrated examples above.

Figure 6:
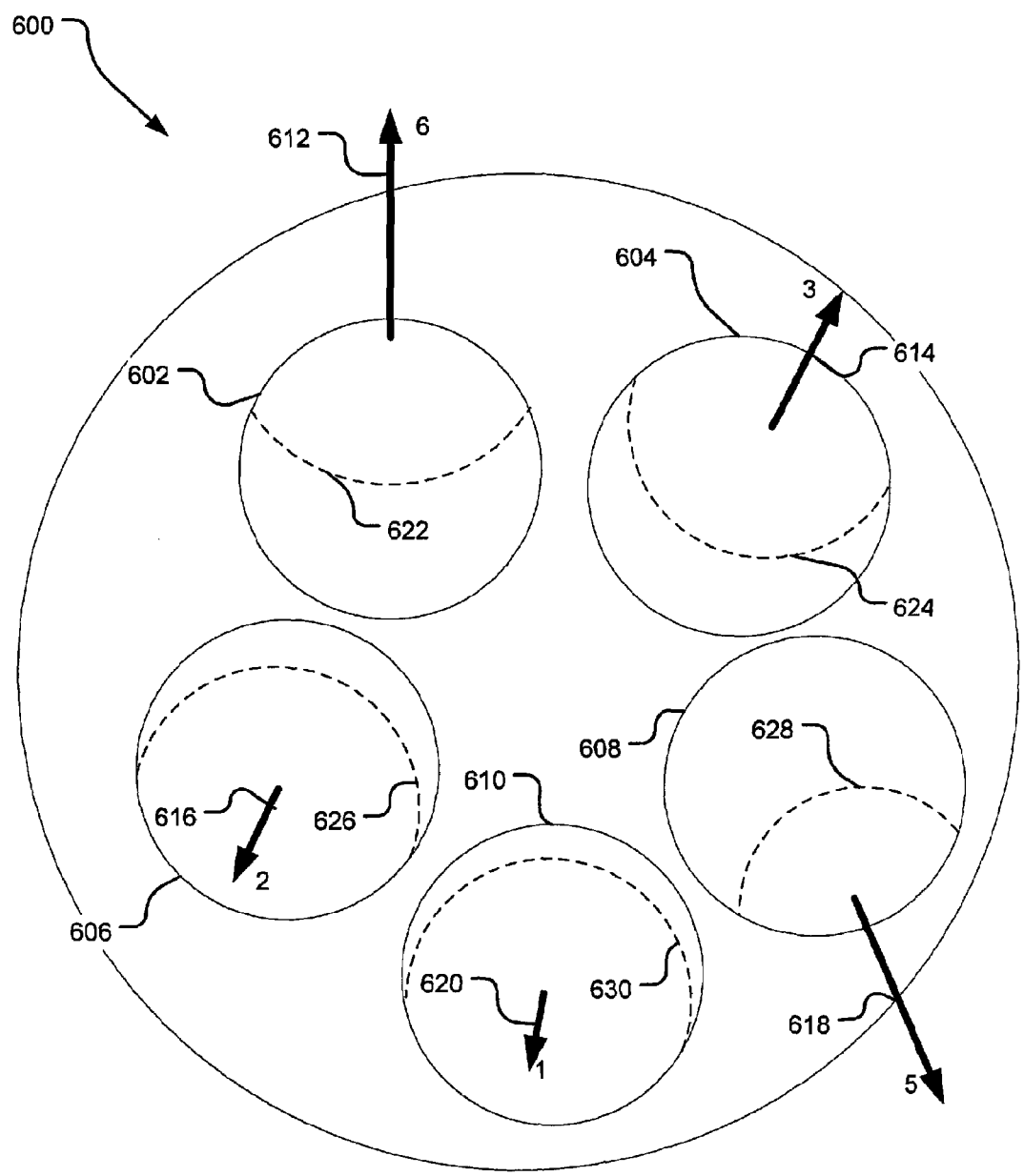
FIG. 6 illustrates an example beamlet steering diagram for steering individual ions at circularly asymmetric steering angles.

FIG. 6 illustrates an example beamlet steering diagram 600 for steering individual ions at circularly asymmetric steering angles. The beamlet steering diagram 600 illustrates an overhead macro view of a portion of a grid assembly. In this portion of the grid assembly, five holes 602, 604, 606, 608, and 610 are illustrated as holes of an acceleration grid. Arrows 612, 614, 616, 618, and 620 represent a steering direction of individual beamlets passing through each hole. Each arrow represents the steering angle of each beamlet as the beamlet passes through a hole in the acceleration grid. Each arrow is drawn in reference to a center axis of each screen grid hole. The dashed arcs 622, 624, 626, 628, and 630 represent a portion of a hole in the screen grid as viewed through the acceleration grid wherein their outline is partially occluded by the corresponding offset hole in the acceleration grid. The numerals next to the tip of each arrow represent the number of degrees each beamlet is steered from its unaltered trajectory in the direction of each corresponding arrow. Additionally, the length of each arrow is representative of the number of degrees each beamlet is steered from its unaltered trajectory. In other words, the longer the arrow, the greater the number of degrees of the steering angle. In the illustrated implementation of FIG. 6, the steering angles of each beamlet passing through the holes of the grid assembly do not follow a common direction such as FIG. 5 where the beamlets were steered in a generally leftward direction.

Exiting acceleration grid hole 602, is a first beamlet steered in a generally upwards direction 612 at an angle of six degrees from the first beamlet's unaltered trajectory. The first beamlet is steered due to an offset in the hole 602 of the acceleration grid relative to a corresponding hole 622 in the screen grid. The dashed arc within the hole 602 represents a portion of the hole 622 in the screen grid as viewed through the acceleration grid and occluded by the offset hole 602 in the acceleration grid. In this example, the hole 602 is offset in the downward direction relative to the hole 622.

Exiting acceleration grid hole 604, is a second beamlet steered in a generally upper right direction 614 at an angle of three degrees from the second beamlet's unaltered trajectory. The second beamlet is steered due an offset in the hole 604 of the acceleration grid relative to a corresponding hole 624 in the screen grid. The dashed arc within the hole 604 represents a portion of the hole 624 in the screen grid as viewed through the acceleration grid and occluded by the offset hole 604 in the acceleration grid. In this example, the hole 604 is offset in the lower left direction relative to the hole 624. It is noted that a larger portion of the hole 624 is visible compared to the hole 622. Since a larger portion of the hole 624 is visible, the second beamlet has a smaller steering magnitude relative to the steering magnitude of the first beamlet (e.g., three degrees of steering vs. six degrees of steering). Further, the hole 604 has less of an offset relative to the hole 624 as compared to the offset of the hole 602 relative to the hole 622.

Exiting acceleration grid hole 606, is a third beamlet steered in a generally lower left direction 616 at an angle of two degrees from the third beamlet's unaltered trajectory. The third beamlet is steered due to an offset in the hole 606 of the acceleration grid relative to a corresponding hole 626 in the screen grid. The dashed arc within the hole 606 represents a portion of the hole 626 in the screen grid as viewed through the acceleration grid and occluded by the offset hole 606 in the acceleration grid. In this example, the hole 606 is offset in the upper right direction relative to the hole 626.

Exiting acceleration grid hole 608, is a fourth beamlet steered in a generally lower right direction 618 at an angle of five degrees from the fourth beamlet's unaltered trajectory. The fourth beamlet is steered due to an offset in the hole 608 of the acceleration grid relative to a corresponding hole 628 in the screen grid. The dashed arc within the hole 608 represents a portion of the hole 628 in the screen grid as viewed through the acceleration grid and occluded by the offset hole 608 in the acceleration grid. In this example, the hole 608 is offset in the upper left direction relative to the hole 628. It is noted that a smaller portion of the hole 628 is visible compared to the hole 626. Since a smaller portion of the hole 628 is visible, the fourth beamlet has a larger steering magnitude relative to the steering magnitude of the third beamlet (e.g., five degrees of steering vs. two degrees of steering). Further, the hole 608 has more of an offset relative to the hole 628 as compared to the offset of the hole 606 relative to the hole 626.

Exiting acceleration grid hole 610, is a fifth beamlet steered in a generally lower left direction 620 at an angle of one degree from the fifth beamlet's unaltered trajectory. The fifth beamlet is steered due to an offset in the hole 610 of the acceleration grid relative to a corresponding hole 630 in the screen grid. The dashed arc within the hole 610 represents a portion of the hole 630 in the screen grid as viewed through the acceleration grid and occluded by the offset hole 610 in the acceleration grid. In this example, the hole 610 is offset in the upper right direction relative to the hole 630.

In one implementation, a method for determining a desired steering angle (e.g., direction and magnitude) for each beamlet of an ion beam may be implemented through one or more formulas. In another implementation, a trial and error method (either empirically or by calculation) may be used to determine a desired steering angle (e.g., direction and magnitude) for each beamlet of an ion beam. For example, a desired steering angle for a beamlet may be achieved by positioning an acceleration grid hole in various offsets relative to a corresponding screen grid hole until the desired steering angle is met. This process may then be repeated for the remaining beamlets, wherein each acceleration grid hole is positioned relative to each adjacent screen grid hole until the desired steering angles for the remaining beamlets are achieved. In one implementation, this process may be automated by multi-parameter optimization algorithms or numerical computer methods for deriving a distribution of steering angles over multiple grids and then multiple grid holes.

In the following description, for the purposes of explanation, numerous specific details are set forth in order to provide a thorough understanding of the present invention. It will be apparent, however, to one skilled in the art that the present invention may be practiced without some of these specific details. For example, while various features are ascribed to particular implementations, it should be appreciated that the features described with respect to one implementation may be incorporated with other implementations as well. By the same token, however, no single feature or features of any described implementation should be considered essential to the invention, as other implementations of the invention may omit such features.

The logical operations may be performed in any order, unless explicitly claimed otherwise or a specific order is inherently necessitated by the claim language. The above specification, examples, and data provide a complete description of the structure and use of example implementations of the invention. Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A method comprising:
propelling a plurality of ion beamlets from a first grid and a second grid, at least one of which with a substantially elliptical pattern of holes, in an elliptically asymmetric distribution of predetermined steering angles.

2. The method of claim 1, further comprising:
propelling the plurality of ion beamlets from the first grid towards the second grid, wherein each predetermined steering angle is achieved by offsetting holes in the second grid relative to corresponding holes in the first grid.

3. The method of claim 2, further comprising:
positioning the first grid downstream of a discharge chamber;
positioning the second grid downstream of the first grid, wherein a first hole of the second grid is offset relative to a corresponding first hole of the first grid, and the first offset yields a first predetermined steering angle of a first ion beamlet, and a second hole of the second grid is offset relative to a corresponding second hole of the first grid, and the second offset yields a second predetermined steering angle of a second ion beamlet, and at a radius from the center of the second grid the first predetermined steering angle is different from the second predetermined steering angle.

4. The method of claim 3, further comprising:
positioning a third grid with a substantially elliptical pattern of holes downstream of the second grid, wherein the first ion beamlet passes through a first hole of the third grid, and the second ion beamlet passes through a second hole of the third grid.

5. The method of claim 2, wherein the first grid has a same applied voltage polarity as a charge polarity of individual ions of the plurality of ion beamlets, and the second grid has an applied voltage polarity opposite of a charge polarity of the individual ions of the plurality of ion beamlets.

6. The method of claim 4, wherein the third grid has a substantially neutral charge.

7. The method of claim 3, wherein the first predetermined steering angle is dependent on a distance between a center axis of the first hole of the first grid and a center axis of the first hole of the second grid, and the second predetermined steering angle is dependent on a distance between a center axis of the second hole of the first grid and a center axis of the second hole of the second grid.

8. The method of claim 3, wherein the first and second predetermined steering angles are dependent on a differential of voltage applied to the first grid and the second grid.

9. The method of claim 4, wherein the first predetermined steering angle $\beta 1$ is derived from the formula:

$$\beta 1 \equiv (-\lambda 1/4\eta g 1)(1-(E2/E1)),$$

and the second predetermined steering angle $\beta 2$ is derived from the formula:

$$\beta 2 \equiv (-\lambda 2/4\eta g 1)(1-(E2/E1)),$$

and $\lambda 1$ is a distance between a center axis of the first hole of the first grid and a center axis of the first hole of the second grid,
and $\lambda 2$ is a distance between a center axis of the second hole of the first grid and a center axis of the second hole or the second grid,
and E1 is (a voltage applied to the first grid–a voltage applied to the second grid)/$\eta g 1$, and E2 is (a voltage applied to the second grid−a voltage applied to the third grid)/ηg2, and ηg1 is a distance between the first grid and the second grid, and ηg2 is a distance between the second grid and the third grid.

10. The method of claim 4, further comprising:

positioning a fourth grid with a substantially elliptical pattern of holes between the second grid and the third grid, wherein a first hole of the fourth grid is offset relative to the first hole of the second grid, and the first ion beamlet is further steered at a first subsequent predetermined steering angle, and a second hole of the fourth grid is offset relative to the second hole in the second grid, and the second ion beamlet is further steered at a second subsequent predetermined steering angle.

11. The method of claim 10, wherein the fourth grid has an applied voltage polarity opposite of the charge polarity of the individual ions of the first and second ion beamlets.

12. The method of claim 10, wherein a summation of the first predetermined steering angle and the first subsequent predetermined steering angle allows for a greater first maximum steering angle than the first predetermined steering angle achieves, and a summation of the second predetermined steering angle and the second subsequent predetermined steering angle allows for a greater second maximum steering angle than the second predetermined steering angle achieves.

13. The method of claim 1, wherein a spatial variation with respect to grid radius in the distribution of the predetermined steering angles is non-monotonic across a radius of the grid assembly.

14. The method of claim 2, wherein each predetermined steering angle is achieved by dishing a surface of at least the second grid.

15. A method of manufacturing a grid assembly comprising:

forming the grid assembly having at least a first grid with a substantially elliptical pattern of holes, wherein the grid assembly is configured to propel a plurality of ion beamlets in an elliptically asymmetric distribution of predetermined steering angles when the first grid is positioned relative to a second grid.

16. The method of claim 15, wherein the grid assembly includes the second grid with a substantially elliptical pattern of holes, and each predetermined steering angle is achieved by offsetting holes in the second grid relative to corresponding holes in the first grid.

17. The method of claim 16, wherein a first hole of the second grid is offset relative to a corresponding first hole of the first grid, and the first offset yields a first predetermined steering angle of a first ion beamlet, and a second hole of the second grid is offset relative to a corresponding second hole of the first grid, and the second offset yields a second predetermined steering angle of a second ion beamlet, and at a radius from the center of the second grid the first predetermined steering angle is different from the second predetermined steering angle.

18. The method of claim 16, wherein the second grid has an applied voltage polarity opposite of a charge polarity of individual ions of the first and second ion beamlets, and the first grid has a same applied voltage polarity as the charge polarity of individual ions of the first and second ion beamlets.

19. The method of claim 17, wherein the first predetermined steering angle is dependent on a distance between a center axis of the first hole of the first grid and a center axis of the first hole of the second grid, and the second predetermined steering angle is dependent on a distance between a center axis of the second hole of the first grid and a center axis of the second hole of the second grid.

20. The method of claim 17, wherein the first and second predetermined steering angles are dependent on a differential of voltage applied to the first grid and the second grid.

21. The method of claim 17, wherein individual ions of the first ion beamlet are attracted towards a closest circumferential portion of the first hole of the second grid as the individual ions of the first ion beamlet approach the first hole of the second grid, and the attraction from the first hole of the second grid alters a trajectory of the individual ions of the first ion beamlet at the first predetermined steering angle, and individual ions of the second ion beamlet are attracted towards a closest circumferential portion of the second hole of the second grid as the individual ions of the second ion beamlet approach the second hole of the second grid, and the attraction from the second hole of the second grid alters a trajectory of the individual ions of the second ion beamlet at the second predetermined steering angle.

22. The method of claim 15, wherein a spatial variation with respect to grid radius in the distribution of the predetermined steering angles is non-monotonic across a radius of the grid assembly.

23. The method of claim 16, wherein each predetermined steering angle is achieved by dishing a surface of at least the second grid.

24. Apparatus comprising:

a discharge chamber adapted to emit an ion beam comprising a plurality of ion beamlets; and a grid assembly coupled to and downstream from the discharge chamber, wherein the grid assembly has at least a first grid with a substantially elliptical pattern of holes, and wherein the grid assembly is configured to propel a plurality of ion beamlets from the grid assembly in an elliptically asymmetric distribution of predetermined steering angles when the first grid is positioned relative to a second grid.

25. The apparatus of claim 24, wherein the grid assembly further includes the second grid with a substantially elliptical pattern of holes positioned downstream of the first grid, and each predetermined steering angle is achieved by offsetting holes in the second grid relative to corresponding holes in the first grid.

26. The apparatus of claim 25, wherein a first hole of the second grid is offset relative to a corresponding first hole of the first grid, and the first offset yields a first predetermined steering angle of a first ion beamlet, and a second hole of the second grid is offset relative to a corresponding second hole of the first grid, and the second offset yields a second predetermined steering angle of a second ion beamlet, and at a radius from the center of the second grid the first predetermined steering angle is different from the second predetermined steering angle.

27. The apparatus of claim 26, further comprising:

a third grid with a substantially elliptical pattern of holes positioned downstream of the second grid, wherein the first ion beamlet passes through a first hole of the third grid, and the second ion beamlet passes through a second hole of the third grid.

28. The apparatus of claim 25, wherein the first grid has a same applied voltage polarity as a charge polarity of individual ions of the plurality of ion beamlets, and the second grid has an applied charge polarity opposite of a charge polarity of the individual ions of the plurality of ion beamlets.

29. The apparatus of claim 27, wherein the third grid has a substantially neutral charge.

30. The apparatus of claim 26, wherein the first predetermined steering angle is dependent on a distance between a center axis of the first hole of the first grid and a center axis of the first hole of the second grid, and the second predetermined steering angle is dependent on a distance between a center axis of the second hole of the first grid and a center axis of the second hole of the second grid.

31. The apparatus of claim 26, wherein the first and second predetermined steering angles are dependent on a differential of voltage applied to the first grid and the second grid.

32. The apparatus of claim 27, wherein the first predetermined steering angle $\beta 1$ is derived from the formula:

$$\beta 1 \equiv (-\lambda 1/4\eta g1)(1-(E2/E1)),$$

and the second predetermined steering angle $\beta 2$ is derived from the formula:

$$\beta 2 \equiv (-\lambda 2/4\eta g1)(1-(E2/E1)),$$

and $\lambda 1$ is a distance between a center axis of the first hole of the first grid and a center axis of the first hole of the second grid, and $\lambda 2$ is a distance between a center axis of the second hole of the first grid and a center axis of the second hole or the second grid, and E1 is (a voltage applied to the first grid–a voltage applied to the second grid)/$fg1$, and E2 is (a voltage applied to the second grid–a voltage applied to the third grid)/$\eta g2$, and $\eta g1$ is a distance between the first grid and the second grid, and $\eta g2$ is a distance between the second grid and the third grid.

33. The apparatus of claim 27, wherein the grid assembly further comprises:
a fourth grid with a substantially elliptical pattern of holes between the second grid and the third grid, wherein a first hole of the fourth grid is offset relative to the first hole of the second grid, and the first ion beamlet is further steered at a first subsequent predetermined steering angle, and a second hole of the fourth grid is offset relative to the second hole in the second grid, and the second ion beamlet is further steered at a second subsequent predetermined steering angle.

34. The apparatus of claim 33, wherein the fourth grid has an applied voltage polarity opposite of the charge polarity of the individual ions of the first and second ion beamlets.

35. The apparatus of claim 33, wherein a summation of the first predetermined steering angle and the first subsequent predetermined steering angle allows for a greater first maximum steering angle than the first predetermined steering angle achieves, and a summation of the second predetermined steering angle and the second subsequent predetermined steering angle allows for a greater second maximum steering angle than the second predetermined steering angle achieves.

36. The apparatus of claim 24, wherein a spatial variation with respect to grid radius in the distribution of the predetermined steering angles is non-monotonic across a radius of the grid assembly.

37. The apparatus of claim 25, wherein each predetermined steering angle is achieved by dishing a surface of at least the second grid.

38. A grid assembly insert comprising:
a first grid with a substantially elliptical pattern of holes configured to propel a plurality of ion beamlets from a grid assembly in an elliptically asymmetric distribution of predetermined steering angles when the first grid is positioned relative to a second grid.

39. The grid assembly insert of claim 38, further comprising:
a second grid wherein each predetermined steering angle is achieved by offsetting holes in the second grid relative to corresponding holes in the first grid.

40. The grid assembly insert of claim 39, wherein a first hole of the second grid is offset relative to a corresponding first hole of the first grid, and the first offset yields a first predetermined steering angle of a first ion beamlet, and a second hole of the second grid is offset relative to a corresponding second hole of the first grid, and the second offset yields a second predetermined steering angle of a second ion beamlet, and at a radius from the center of the second grid the first predetermined steering angle is different from the second predetermined steering angle.

41. The grid assembly insert of claim 39, wherein the second grid has an applied voltage polarity opposite of a charge polarity of the individual ions of the first and second ion beamlets, and the first grid has a same applied voltage polarity as a charge polarity of the individual ions of the first and second ion beamlets.

42. The grid assembly insert of claim 40, wherein the first predetermined steering angle is dependent on a distance between a center axis of the first hole of the first grid and a center axis of the first hole of the second grid, and the second predetermined steering angle is dependent on a distance between a center axis of the second hole of the first grid and a center axis of the second hole of the second grid.

43. The grid assembly insert of claim 40, wherein the first and second predetermined steering angles are dependent on a differential of voltage applied to the first grid and the second grid.

44. The grid assembly insert of claim 40, wherein individual ions of the first ion beamlet are attracted towards a closest circumferential portion of the first hole of the second grid as the individual ions of the first ion beamlet approach the first hole of the second grid, and the attraction from the first hole of the second grid alters a trajectory of the individual ions of the first ion beamlet at the first predetermined steering angle, and individual ions of the second ion beamlet are attracted towards a closest circumferential portion of the second hole of the second grid as the individual ions of the second ion beamlet approach the second hole of the second grid, and the attraction from the second hole of the second grid alters a trajectory of the individual ions of the second ion beamlet at the second predetermined steering angle.

45. The grid assembly insert of claim 38, wherein a spatial variation with respect to grid radius in the distribution of the predetermined steering angles is non-monotonic across a radius of the grid assembly.

46. The grid assembly insert of claim 39, wherein each predetermined steering angle is achieved by dishing a surface of at least the second grid.

47. A system comprising:
a pair of ion beam grids, each with a substantially elliptical pattern of holes; and
means for steering individual ion beamlets from the ion beam grids in a predetermined elliptically asymmetric distribution.

48. A method comprising:
propelling a plurality of ion beamlets from a first grid and a second grid, at least one of which with a substantially circular pattern of holes, in a circularly asymmetric distribution of predetermined steering angles.

49. A method of manufacturing a grid assembly comprising:
forming the grid assembly having at least a first grid with a substantially circular pattern of holes, wherein the grid assembly is configured to propel a plurality of ion beamlets in a circularly asymmetric distribution of predetermined steering angles when the first grid is positioned relative to a second grid.

50. Apparatus comprising:
a discharge chamber adapted to emit an ion beam comprising a plurality of ion beamlets; and
a grid assembly coupled to and downstream from the discharge chamber, wherein the grid assembly has at least a first grid with a substantially circular pattern of holes, and wherein the grid assembly is configured to propel a plurality of ion beamlets from the grid assembly in a circularly asymmetric distribution of predetermined steering angles when the first grid is positioned relative to a second grid.

51. A grid assembly insert comprising:
a first grid with a substantially circular pattern of holes configured to propel a plurality of ion beamlets from a grid assembly in a circularly asymmetric distribution of predetermined steering angles when the first grid is positioned relative to a second grid.

52. A system comprising:
a pair of ion beam grids, each with a substantially circular pattern of holes; and
means for steering individual ion beamlets from the ion beam grids in a predetermined circularly asymmetric distribution.

53. The grid assembly insert of claim 40, further comprising:
a third grid with a substantially elliptical pattern of holes, wherein the first grid is further positioned relative to the third grid downstream of the second grid, and wherein the first ion beamlet passes through a first hole of the third grid, and the second ion beamlet passes through a second hole of the third grid.

54. The grid assembly insert of claim 53, wherein the third grid has a substantially neutral charge.

55. The grid assembly insert of claim 53, wherein the first predetermined steering angle $\beta 1$ is derived from the formula:

$$\beta 1 \equiv (-\lambda 1/4\eta g1)(1-(E2/E1)),$$

and the second predetermined steering angle $\beta 2$ is derived from the formula:

$$\beta 2 \equiv (-\lambda 2/4\eta g1)(1-(E2/E1)),$$

and $\lambda 1$ is a distance between a center axis of the first hole of the first grid and a center axis of the first hole of the second grid,
and $\lambda 2$ is a distance between a center axis of the second hole of the first grid and a center axis of the second hole or the second grid,
and E1 is (a voltage applied to the first grid–a voltage applied to the second grid)/$fg1$,
and E2 is (a voltage applied to the second grid–a voltage applied to the third grid)/$\eta g2$,
and $\eta g1$ is a distance between the first grid and the second grid,
and $\eta g2$ is a distance between the second grid and the third grid.

56. The grid assembly insert of claim 53, further comprising:
a fourth grid with a substantially elliptical pattern of holes positioned between the second grid and the third grid, wherein a first hole of the fourth grid is offset relative to the first hole of the second grid, and the first ion beamlet is further steered at a first subsequent predetermined steering angle, and a second hole of the fourth grid is offset relative to the second hole in the second grid, and the second ion beamlet is further steered at a second subsequent predetermined steering angle.

57. The grid assembly insert of claim 56, wherein the fourth grid has an applied voltage polarity opposite of the charge polarity of the individual ions of the first and second ion beamlets.

58. The grid assembly insert of claim 56, wherein a summation of the first predetermined steering angle and the first subsequent predetermined steering angle allows for a greater first maximum steering angle than the first predetermined steering angle achieves, and a summation of the second predetermined steering angle and the second subsequent predetermined steering angle allows for a greater second maximum steering angle than the second predetermined steering angle achieves.

* * * * *